(12) United States Patent
Sheehan et al.

(10) Patent No.: US 7,312,281 B2
(45) Date of Patent: Dec. 25, 2007

(54) ANHYDROUS, LIQUID PHASE PROCESS FOR PREPARING HYDROXYL CONTAINING POLYMERS OF ENHANCED PURITY

(75) Inventors: Michael T. Sheehan, Corpus Christi, TX (US); James R. Sounik, Corpus Christi, TX (US)

(73) Assignee: DuPont Electronic Polymers L.P., Research Triangle Park, NC (US)

( * ) Notice: Subject to any disclaimer, the term of this patent is extended or adjusted under 35 U.S.C. 154(b) by 0 days.

(21) Appl. No.: 11/066,337

(22) Filed: Feb. 24, 2005

(65) Prior Publication Data

US 2005/0142488 A1 Jun. 30, 2005

Related U.S. Application Data

(63) Continuation-in-part of application No. 10/126,563, filed on Apr. 19, 2002, now Pat. No. 6,864,324.

(51) Int. Cl.
*C07C 112/08* (2006.01)
*C08C 19/22* (2006.01)

(52) U.S. Cl. .................. 525/328.9; 525/329.5; 525/333.3; 525/333.5; 525/333.6; 525/344; 525/346; 525/367; 525/369; 525/374; 525/378

(58) Field of Classification Search ............. 525/328.9, 525/329.5, 333.3, 333.5, 333.6, 344, 346, 525/367, 369, 374, 378
See application file for complete search history.

(56) References Cited

U.S. PATENT DOCUMENTS 6,864,324 B2 * 3/2005 Sheehan et al. ......... 525/328.9

* cited by examiner

*Primary Examiner*—Robert D. Harlan
(74) *Attorney, Agent, or Firm*—James J. Mullen

(57) ABSTRACT

An anhydrous, liquid phase process for preparing hydroxyl containing polymers of enhanced purity comprising the steps of polymerization, purification, transesterification, purification, catalyst removal, and solvent exchange. The resultant polymer in solution can be used directly, without further processing steps, to prepare a photoresist composition.

36 Claims, No Drawings

ANHYDROUS, LIQUID PHASE PROCESS FOR PREPARING HYDROXYL CONTAINING POLYMERS OF ENHANCED PURITY

RELATED PATENT APPLICATIONS

This patent application is a continuation in part of patent application, Ser. No. 10/126,563 filed on Apr. 19, 2002 now U.S. Pat. No. 6,864,324.

BACKGROUND OF THE INVENTION

1. Field of the Invention

The present invention relates to processes for preparing substantially pure hydroxyl—containing polymers including homopolymers, and copolymers such as terpolymers and tetrapolymers in a liquid phase operation which is substantially anhydrous. These polymers are then converted into photoresist compositions for use as such.

2. Description of the Prior Art

There is a desire in the industry for higher circuit density in microelectronic devices that are made using lithographic techniques. One method of increasing the number of components per chip is to decrease the minimum feature size on the chip, which requires higher lithographic resolutions. The use of shorter wavelength radiation (e.g., deep UV e.g. 190 to 315 nm) than the currently employed mid-UV spectral range (e.g. 350 nm to 450 nm) offers the potential for higher resolution. However, with deep UV radiation, fewer photons are transferred for the same energy dose and higher exposure doses are required to achieve the same desired photochemical response. Further, current lithographic tools have greatly attenuated output in the deep UV spectral region.

In order to improve sensitivity, several acid catalyzed chemically amplified resist compositions have been developed such as those disclosed in U.S. Pat. No. 4,491,628 (Jan. 1, 1985) and Nalamasu et al, "An Overview of Resist Processing for Deep UV Lithography", 3. Photopolymer Sci. Technol. 4, 299 (1991). The resist compositions generally comprise a photosensitive acid generator and an acid sensitive polymer. The polymer has acid sensitive side chain (pendant) groups that are bonded to the polymer backbone and are reactive towards a proton. Upon imagewise exposure to radiation, the photoacid generator produces a proton. The resist film is heated and, the proton causes catalytic cleavage of the pendant group from the polymer backbone. The proton is not consumed in the cleavage reaction and catalyzes additional cleavage reactions thereby chemically amplifying the photochemical response of the resist. The cleaved polymer is soluble in polar developers such as alcohol and aqueous base while the unexposed polymer is soluble in non-polar organic solvents such as anisole. Thus the resist can produce positive or negative images of the mask depending of the selection of the developer solvent. Although chemically amplified resist compositions generally have suitable lithographic sensitivity, in certain applications, their performance can be improved by (i) increasing their thermal stability in terms of thermal decomposition and plastic flow and (ii) increasing their stability in the presence of airborne chemical contaminants. For example, in some semiconductor manufacturing processes, post image development temperatures (e.g. etching, implantation etc.) can reach 200° C. Brunsvold et al., U.S. Pat. No. 4,939,070 (issued Jul. 3, 1990) and U.S. Pat. No. 4,931,379 (issued Jun. 5, 1990) disclose chemically amplified, acid sensitive resist compositions having increased thermal stability in the post image development stage. Brunsvold's resist compositions form a hydrogen bonding network after cleavage of the acid sensitive side chain group to increase the thermal stability of the polymer. Brunsvold avoids hydrogen-bonding moieties prior to the cleavage reaction because such hydrogen bonding is known to unacceptably destabilize the acid sensitive side chain. Although Brunsvold resists have suitable thermal stability, they also have lower sensitivity and therefore are unsuitable in certain applications.

With respect to chemical contamination, MacDonald et al. SPIE 14662. (1991) reported that due to the catalytic nature of the imaging mechanisms, chemically amplified resist systems are sensitive toward minute amounts of airborne chemical contaminants such as basic organic substances. These substances degrade the resulting developed image in the film and cause a loss of the linewidth control of the developed image. This problem is exaggerated in a manufacturing process where there is an extended and variable period of time between applying the film to the substrate and development of the image. In order to protect the resist from such airborne contaminants, the air surrounding the coated film is carefully filtered to remove such substances. Alternatively, the resist film is overcoated with a protective polymer layer. However, these are cumbersome processes.

Therefore, there was a need in the art for an acid sensitive, chemically amplified photoresist composition having high thermal stability and stability in the presence of airborne chemical contaminants for use in semiconductor manufacturing. Apparently, this was accomplished in the invention outlined in U.S. Pat. No. 5,625,020 which relates to a photosensitive resist composition comprising (i) a photosensitive acid generator and (ii) a polymer comprising hydroxystyrene and acrylate, methacrylate or a mixture of acrylate and methacrylate. The resist has high lithographic sensitivity and high thermal stability. The resist also exhibits surprising stability in the presence of airborne chemical contaminants. However, one of the problems with this composition was that the process of preparing the polymer as outlined in column 3, lines 10-30 and in Example 1 (of U.S. Pat. No. 5,625,020) results in poor conversion rates and chemical cleavage of some groups in the repeat units. Thus, one of the objects of the present invention is an improved process for preparing the polymers used in the photoresist compositions.

The processes of the present invention provide methods which are fast, clean, anhydrous, and render the analysis of catalyst used therein an easy manner. Furthermore, the polymer in solution, if desired can be further treated to provide a photoresist composition which can be directly used without isolating the polymer beforehand.

PRIOR ART

The following references are disclosed as general background information.

1. U.S. Pat. No. 4,898,916 discloses a process for the preparation of poly(vinylphenol) from poly(acetoxystyrene) by acid catalyzed transesterification.

2. U.S. Pat. No. 5,239,015 discloses a process for preparing low optical density polymers and co-polymers for photoresists and optical applications.

3. U.S. Pat. No. 5,625,007 discloses a process for making low optical polymers and co-polymers for photoresists and optical applications.

4. U.S. Pat. No. 5,625,020 discloses a process for making a photoresist composition containing a photosensitive acid generator and a polymer comprising the reaction product of hydroxystyrene with acrylate, methacrylate or a mixture of acrylate and methacrylate.

5. EP 0813113 Al, Barclay, discloses an aqueous transesterification to deprotect the protected polymer.

6. WO 94 14858 A discloses polymerizing hydroxystyrene without the protecting group.

Other patents of interest are U.S. Pat. No. 4,679,843; U.S. Pat. No. 4,822,862; U.S. Pat. No. 4,912,173; U.S. Pat. No. 4,962,147; U.S. Pat. No. 5,087,772; U.S. Pat. No. 5,304,610; U.S. Pat. No. 5,789,522; U.S. Pat. No. 5,939,511; and U.S. Pat. No. 5,945,251.

All of the references described herein are incorporated herein by reference in their entirety.

SUMMARY OF THE INVENTION

This invention relates to a novel "one-pot", cost efficient process for the preparation of hydroxyl containing polymers such as homo-, co-, and terpolymers of (1) p-hydroxystyrene (PHS) or substituted p-hydroxystyrene (SPHS) alone or in combination with (2) alkyl acrylates (AA) and/or (3) other monomers such as ethylenically unsaturated copolymerizable monomers (EUCM). This unique and novel process involves multi-steps depending upon the polymer being formed and which when completed yield a hydroxyl containing polymer in solution and having enhanced purity. The steps start with (1) the polymerization of a substituted styrene (alive if one is making a homopolymer) or substituted styrene and/or AA and/or EUCM in an alcohol solvent in the presence of a free radical initiator. (2) Purification of the product from step (1) by fractionation with an alcohol solvent. (3) Transesterification of the product from step (2) in the presence of a catalyst. (4) Purification of the product from step (3) by another solvent, immiscible with the alcohol solvent, under distillation conditions. (5) Catalyst removal via ion exchange of the product from step (3). (6) A "Solvent Swap" of the product of step 5 wherein said alcohol solvent is removed and replaced by a photoresist or photosensitive coating compatible solvent. Some preferred embodiments include a substantially pure homopolymers of p-hydroxystyrene (PHS), copolymers of p-hydroxystyrene, tert-butyl acrylate and terpolymer of p-hydroxystyrene, tert-butyl acrylate and styrene. These hydroxyl containing polymers have a wide variety of applications including as photoresists in microelectronics industry.

DETAILED DESCRIPTION OF THE INVENTION

The present invention thus provides, in part, a novel process for producing polymers that are used in photoresist compositions. The process is an improvement over the prior art and is quite efficient. Specifically, this invention provides a process for the preparation of a hydroxyl containing polymer of I,

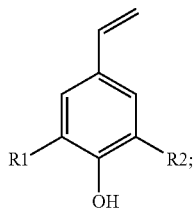

either alone or in combination with an acrylate monomer having the formula II,

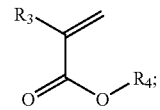

and/or with one or more ethylenically unsaturated copolymerizable monomers (EUCM) selected from the group consisting of styrene, 4-methylstyrene, styrene alkoxide wherein the alkyl portion is $C_1$-$C_5$ straight or branch chain, maleic anhydride, dialkyl maleate, dialkyl fumarate and vinyl chloride, wherein alkyl is having 1 to 4 carbon atoms, comprising the following steps.

Step 1—Polymerization

In this step, a substituted styrene monomer of formula III,

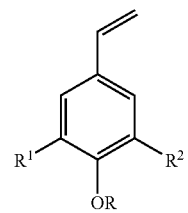

wherein R is either —C(O)$R^5$ or —$R^5$; either alone (if preparing a homopolymer) or in combination with said monomer II, and/or one or more of said copolymerizable monomers (EUCM) is subjected to suitable polymerization conditions in a carboxylic alcohol solvent and in the presence of a free radical initiator at suitable temperature for a sufficient period of time to produce a polymer of corresponding composition.

In the above formulae I, II, and III, the following are the definitions:

i) $R^1$ and $R^2$ are the same or different and independently selected from the group consisting of:
hydrogen;
fluorine, chlorine or bromine;
alkyl or fluoroalkyl group having the formula $C_nH_xF_y$, where n is an integer from 1 to 4, x and y are integers from 0 to 2n+1, and the sum of x and y is 2n+1; and
phenyl or tolyl;

ii) $R^3$ is selected from the group consisting of:
hydrogen; and
methyl, ethyl, n-propyl, iso-propyl, n-butyl, i-butyl or t-butyl;

iii) $R^4$ is selected from the group consisting of methyl, ethyl, n-propyl, i-propyl, n-butyl, i-butyl, t-butyl, t-amyl, benzyl, cyclohexyl, 9-anthracenyl, 2-hydroxyethyl, cinnamyl, adamantly, methyl or ethyl adamantly, isobornyl, 2-ethoxyethyl, n-heptyl, n-hexyl, 2-hydroxypropyl, 2-ethylbutyl, 2-methoxypropyl, 2-(2-methoxyethoxyl), 2-naphthyl, 2-phenylethyl, phenyl, and the like.

iv) $R^5$ is $C_1$-$C_5$ alkyl, either straight or branch chain.

It is also within the scope of the present invention to prepare a homopolymer of formula I from the monomer of formula III. As one preferred embodiment, polyhydroxystyrene (PHS) can be prepared from acetoxystyrene monomer (ASM) according to the novel processes set forth herein.

The scope of the present invention thus covers (a) a homopolymer of formula I derived from formula III monomer; (b) a copolymer derived from formula II and formula III monomers; (c) a copolymer derived from formula III monomers and the EUCM; and (d) a terpolymer derived from monomers of formula II, formula III and EUCM.

In conjunction with formula II (an acrylate monomer) set forth herein, some preferred acrylate monomers are (1) MAA—methyl adamantyl acrylate, (2) MAMA—methyl adamantly methacrylate, (3) EAA—ethyl adamantyl acrylate, (4) EAMA—ethyl adamantyl methacrylate, (5) ETCDA—ethyl tricyclodecanyl acrylate, (6) ETCDMA—ethyl tricyclodecanyl methacrylate, (7) PAMA—propyl adamantyl methacrylate, (8) MBAMA—methoxybutyl adamantyl methacrylate, (9) MBAA—methoxylbutyl adamantyl acrylate, (10) isobornylacrylate, (11) isobornylmethacrylate, (12) cyclohexylacrylate, and (13) cyclohexylmethacrylate.

Co-polymers having polyhydroxystyrene (PHS) and one or more of the above acrylate monomers are some of the materials that are made by the novel processes of the present invention.

In another embodiment in this step 1, the reaction mixture may also comprise an additional co-solvent. The co-solvent is selected from the group consisting of tetrahydrofuran, methyl ethyl ketone, acetone, and 1,4-dioxane.

The carboxylic alcohol solvent is an alcohol having 1 to 4 carbon atoms and is selected from the group consisting of methanol, ethanol, isopropanol, tert-butanol, and combinations thereof The amount of solvent (and/or second solvent) used is not critical and can be any amount which accomplishes the desired end result.

The free radical initiator may be any initiator that achieves the desired end result. The initiator may be selected from the group consisting of 2,2'-azobis(2,4-dimethylpentanenitrile), 2,2'-azobis(2-methylpropanenitrile), 2,2'-azobis (2-methylbutanenitrile), 1,1'-azobis(cyclohexanecarbonitrile), t-butyl peroxy-2-ethylhexanoate, t-butyl peroxypivalate, t-amyl peroxypivalate, diisononanoyl peroxide, decanoyl peroxide, succinic acid peroxide, di(n-propyl)peroxydicarbonate, di(sec-butyl) peroxydicarbonate, di(2-ethylhexyl) peroxydicarbonate, t-butylperoxyneodecanoate, 2,5-dimethyl-2,5-di(2-ethylhexanoylperoxy)hexane, t-amylperoxyneodecanoate, dimethyl 2,2'-azobisisobutyrate and combinations thereof.

As a preferred embodiment, the initiator is selected from the group consisting of 2,2'-azobis(2,4-.dimethylpentanenitrile), 2,2'-azobis(2-metbylpropanenitrile), 2,2'-azobis(2-methylbutanenitrile), 1,1'-azobis(cyclohexanecarbonitrile), t-butyl peroxy-2-ethylhexanoate, t-butyl peroxypivalate, t-amyl peroxypivalate, and combinations thereof.

The amount of initiator is any amount that accomplishes the desired end result. However, as a preferred embodiment, said initiator is present to about three mole percent based upon the total moles of all of said monomers I, II, and said copolymerizable monomers.

The polymerization conditions are any temperature and pressure that will produce the desired end result. In general, the temperatures are from about 30° C. to about 100° C., preferably from about 40° C. to about 100° C., and most preferably from about 45° C. to about 90° C. The pressure may be atmospheric, sub-atmospheric or super-atmospheric. The polymerization time is not critical, but generally will take place over a period of at least one minute in order to produce a polymer of corresponding composition.

Step 2—Purification

After the polymerization of step 1, and prior to the transesterification of step 3, the polymer from step 1 is subjected to a purification procedure wherein the same type carboxylic alcoholic solvent (first solvent) is used to purify the polymer via a multi-step fractionation process. Additional first solvent is added to the polymer mixture of step 1, and the resultant slurry is stirred vigorously and/or heated to boiling (about 66° C.) for several minutes, and then chilled to as low as 25° C. and allowed to stand. This permits the slurry to produce a phase separation, and then the liquid is removed by centrifugation, filtration, decantation or by similar means. The process is repeated at least one more time until no further purification is identified, as for example, until a small sample of the decanted solvent, upon evaporation to dryness shows substantially no residue. This fractionation process is generally carried out 2 to 10 times, i.e. heating, cooling, separating, and the solvent replacement.

One of the important measures of the degree of impurity of the crude polymer produced from the polymerization of the monomers is the polydispersity value. In general, it is desirable to have a low value, for example, less than about 3; the lower value is indicative that the polymerization reaction was more uniform in chain length. The uniqueness of this purification step is that the desired polymer formed is, to some degree, not soluble in the solvent and that the undesired, low molecular weight average polymers and undesired monomers are soluble in the solvent. Thus the novel purification/fractionalization provides the removal of these undesirable materials. In general, the polydispersity of the crude polymer is measured before, during and after this purification/fractionalization step, with the objective of reducing this value by at least about 10% of what the value of the original crude polymer was before the purification treatment. Preferably, it is desirable to yield a product whose polydispersity is below about 2.0. It is to be understood that polydispersity means the ratio of weight average molecular weight (Mw) over the number average molecular weight (Mn) as determined by Gel Permeation Chromatography (GPC).

Step 3—Transesterification

In transesterification step, the polymer/solvent mixture from step 2 is subjected to transesterification conditions in said alcohol solvent in the presence of a catalytic amount of a transesterification catalyst. The catalyst is such that it will not substantially react with the polymer, or said alkyl acrylate monomer II, or with said co-polymerizable monomers (EUCM). The catalyst is selected from the group consisting of (anhydrous) ammonia, lithium methoxide, lithium ethoxide, lithium isopropoxide, sodium methoxide, sodium ethoxide, sodium isopropoxide, potassium methoxide, potassium ethoxidc, potassium isopropoxide, cesium methoxide, cesium ethoxide, cesium isopropoxide, and combinations thereof, wherein the carboxylic alkoxide anion is similar to the carboxylic alcohol solvent. It is also to be understood that the catalyst can be alkali metal hydroxides such as lithium hydroxide, sodium hydroxide, potassium hydroxide, cesium hydroxide and combinations thereof. If the monomer being used is —OR where it is —OR$^5$, then the catalyst is a strong acid such as mineral acids such as HCL.

The amount of catalyst employed is from about 0.1 mole percent to about 2 mole percent of monomer I present in the composition of said polymer.

In a preferred embodiment, the catalyst is added in step (b) as a solution in said alcohol solvent.

The temperature in step (b) is such that the transesterified by-product ester formed can be continually removed from the reaction mixture to form the polymer of I, II, and said copolymerizable monomer. Such temperatures can be from about 50° C. to about 200° C. In a preferred embodiment, the transesterification reaction is carried out at reflux temperature of said alcohol solvent.

Step 4—Purification

This purification step comes before the catalyst removal step (5). According to this step 4, there is added to the polymer in an alcoholic solution, a second solvent which is immiscible with said alcohol solvent until a second layer is formed. In this fashion, the desired polymer is insoluble in said second solvent, but the undesired impurities are soluble in said second solvent. The mixture is then stirred vigorously and/or is heated to boiling for several minutes and then allowed to stand until cool. This allows the layers of polymer and mixed solvents to separate. A portion of said solvent mixture is removed and any dissolved impurities and low weight average molecular weight polymers dissolved therein are also removed. This removal can be accomplished by decantation or similar means, and the process is repeated until no further purification is identified, as for example, until a small sample of the decanted second (non-alcohol) solvent upon evaporation to dryness shows no residue. In this fashion, there are removed by-products and low weight average molecular weight materials.

The alcoholic solution of the polymer is then subjected to distillation to remove the remaining second solvent, which was miscible in the alcohol. Most often removal of the second solvent is accomplished by azeotropic distillation; the azeotropic mixture boiling below the boiling temperature of either the alcohol or the second solvent.

Typical second solvents useful for the method of this step include hexane, heptane, octane, petroleum ether, ligroin, lower alkyl halohydrocarbons, i.e., methylene chloride, and the like.

Step 5—Catalyst Removal

In view of the nature of the catalyst employed in step 3, it is critical that it be removed from the system. In this step, there is employed a cation-exchange resin preferably a acidic cation exchange resin, to accomplish the desired end result. An acidic ion exchange resin, such as sulfonated styrene/divinylbenzene cation exchange resin in hydrogen-form is preferably utilized in the present process. Suitable acidic exchange resins are available from Rohm and Haas Company, e.g. AMBERLYST 15 acidic ion exchange resin. These Amberlyst resins typically contain as much as 80,000 to 200,000 ppb of sodium and iron. Before being utilized in the process of the invention, the ion exchange resin must be treated with water and then a mineral acid solution to reduce the metal ion level. When removing the catalyst from the polymer solution, it is important that the ion exchange resin be rinsed with a solvent that is the same as, or at least compatible with, the polymer solution solvent. The procedure in step (c) may be similar to those procedures disclosed in U.S. Pat. No. 5,284,930 and U.S. Pat. No. 5,288,850.

Step 6—Solvent Swap

In this step, the purified polymer is solvent exchanged with a third or aprotic/organic solvent which is a photoresist or photosensitive coating compatible solvent, and the alcoholic solvent is removed by distillation. This third solvent is at least one member selected from glycol ethers, glycol ether acetates and aliphatic esters having no hydroxyl or keto group. Examples of the solvent include glycol ether acetates such as ethylene glycol monoethyl ether acetate and propylene glycol monomethyl ether acetate (PGMEA) and esters such as ethyl-3-ethoxypropionate, methyl-3-methoxypropionate, among which PGMEA is preferred. These solvents may be used alone or in the form of a mixture thereof.

Further examples of the third solvent include butyl acetate, amyl acetate, cyclohexyl acetate, 3-methoxybutyl acetate, methyl ethyl ketone, methyl amyl ketone, cyclohexanone, cyclopentanone, 3-ethoxyethyl propionate, 3-ethoxymethyl propionate, 3-methoxymethyl propionate, methyl acetoacetate, ethyl acetoacetate, diacetone alcohol, methyl pyruvate, ethyl pyruvate, propylene glycol monomethyl ether, propylene glycol monoethyl ether, propylene glycol monomethyl ether propionate, propylene glycol monoethyl ether propionate, ethylene glycol monomethyl ether, ethylene glycol monoethyl ether, diethylene glycol monomethyl ether, diethylene glycol monoethyl ether, 3-methyl-3-methoxybutanol, N-methylpyrrolidone, dimethylsulfoxide, γ-butyrolactone, propylene glycol methyl ether acetate, propylene glycol ethyl ether acetate, propylene glycol propyl ether acetate, methyl lactate, ethyl lactate, propyl lactate, and tetramethylene sulfone. Of these, the propylene glycol alkyl ether acetates and alkyl lactates are especially preferred. The solvents may be used alone or in admixture of two or more. An exemplary useful solvent mixture is a mixture of a propylene glycol alkyl ether acetate and an alkyl lactate. It is noted that the alkyl groups of the propylene glycol alkyl ether acetates are preferably those of 1 to 4 carbon atoms, for example, methyl, ethyl and propyl, with methyl and ethyl being especially preferred. Since the propylene glycol alkyl ether acetates include 1,2- and 1,3-substituted ones, each includes three isomers depending on the combination of substituted positions, which may be used alone or in admixture. It is also noted that the alkyl groups of the alkyl lactates are preferably those of 1 to 4 carbon atoms, for example, methyl, ethyl and propyl, with methyl and ethyl being especially preferred.

When the propylene glycol alkyl ether acetate is used as the solvent, it preferably accounts for at least 50% by weight of the entire solvent. Also when the alkyl lactate is used as the solvent, it preferably accounts for at least 50% by weight of the entire solvent. When a mixture of propylene glycol alkyl ether acetate and alkyl lactate is used as the solvent, that mixture preferably accounts for at least 50% by weight of the entire solvent. In this solvent mixture, it is further preferred that the propylene glycol alkyl ether acetate is 60 to 95% by weight and the alkyl lactate is 40 to 5% by weight. A lower proportion of the propylene glycol alkyl ether acetate would invite a problem of inefficient coaling whereas a higher proportion thereof would provide insufficient dissolution and allow for particle and foreign matter formation. A lower proportion of the alkyl lactate would provide insufficient dissolution and cause the problem of many particles and foreign matter whereas a higher proportion thereof would lead to a composition which has a too high viscosity to apply and loses storage stability.

Usually the solvent is used in amounts of about 300 to 2,000 parts, preferably about 400 to 1,000 parts by weight per 100 parts by weight of the solids in the chemically amplified positive resist composition. The concentration is not limited to this range as long as film formation by existing methods is possible.

The aforementioned solvents are also compatible with photosensitive coatings including the photosensitive antireflective coatings ARCs and which are exemplified in U.S. Pat. No. 5,674,648 and U.S. Pat. No. 6,653,411 B2 and which are incorporated herein by reference.

Step 7—Addition Reaction Blocking

The substantially pure hydroxyl containing polymer in solution (i.e. third solvent) from step 6 is then subjected to an additional reaction to provide said polymer with protective or blocking groups (sometimes referred to as acid labile groups) in order to protect the functional/hydroxyl groups. In some cases, this blocking can be either fully blocked or partially blocked. In this step, the polymer in solution from step 6 is reacted with a vinyl ether compound and/or a dialkyl dicarbonate in the presence of a catalyst in the aprotic solvent (i.e. third solvent). When the polymer is reacted with the vinyl ether, it is done in the presence of an acid catalyst followed by adding a base thereto to neutralize it and thus stop the reaction; this is generally called an acetalization wherein an acetal derivatized hydroxyl containing polymer is formed. When the polymer from step 6 is reacted with a dialkyl dicarbonate, this is an alcoholysis by use of an anhydride (dicarbonate) in the presence of base catalyst which is used as a reaction catalyst.

The vinyl ethers suitable for use a protective group include those falling within the formula

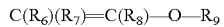

Wherein $R_6$, $R_7$ and $R_8$ are independently represent a hydrogen atom or a straight-chain, branched, cyclic or heterocyclic alkyl group containing 1 to 6 carbon atoms, and $R_9$ represents a straight-chain, branched, cyclic or hetero-cyclic alkyl or aralkyl group containing 1 to 10 carbon atoms which may be substituted with a halogen atom, an alkoxy group aralkyl oxycarbonyl group and/or alkyl carbonyl amino group.

The vinyl ether compounds represented by the general formula, described above include vinyl ethers such as methyl vinyl ether, ethyl vinyl ether, n-butyl vinyl ether, tert-butyl vinyl ether, 2-chloro-ethyl vinyl ether, 1-methoxy-ethyl vinyl ether, 1-benzyloxyethyl vinyl ether etc.; and isopropenyl ethers such as isopropenyl methyl ether, isopropenyl ethyl ether etc.

Preferable examples of cyclic vinyl ethers include 3,4-dihydro-2H-pyran etc., and preferable examples of divinyl ethers include butanediol-1,4-divinyl ether, ethylene glycol divinyl ether, triethylene glycol divinyl ether etc.

These vinyl ether compounds can be used alone or in combination thereof. The vinyl ether compounds in total are used preferably in a ratio of 0.1 to 0.7 mol equivalent to the phenolic hydroxyl or carboxyl group of the alkali-soluble polymer having phenolic hydroxyl or carboxyl group.

Preferable examples of the dialkyl dicarbonate used in the present invention include di-tert-butyl dicarbonate. As with the vinyl ether compounds, the amount of the dialkyl dicarbonate used is preferably 0.1 to 0.7 mol equivalent to the phenolic hydroxyl or carboxyl group of the alkali-soluble polymer having a phenolic hydroxyl or carboxyl group.

In the present invention, at least one vinyl ether compound and at least one dialkyl dicarbonate can be used simultaneously for protection of a single alkali-soluble polymer described above.

If the resist materials to be synthesized are used as a component of a resist composition exposed with e.g KrF exeimer laser radiation, it is preferable to use a catalyst showing no absorption at 248 nm i.e. the exposure wavelength of KrF exeimer laser. Accordingly, when an acid is used as the reaction catalyst, the acid is not to have a benzene ring preferably. Examples of acids which can be used as the reaction catalyst in the present invention include mineral acids such as hydrochloric acid, sulfuric acid etc., organic sulfonic acids such as methanesulfonic acid, camphorsulfonic acid etc. or halocarboxylic acids such as trifluoroacetic acid, trichloroacetic acid etc. The amount of the acid used is preferably 0.1 to 10 mmol equivalents to the phenolic hydroxyl or carboxyl group of the polymer having a phenolic hydroxyl or carboxyl group.

In the case where (+/−) camphorsulfonic acid is used as the reaction catalyst in the form of solution thereof in propylene glycol monomethyl ether acetate, if said solution is heated or stored for a long period of time, the propylene glycol monomethyl ether acetate is hydrolyzed to generate propylene glycol monomethyl ether (PGME) by which the reaction is significantly inhibited. Accordingly, the solution of (+/−)camphorsulfonic acid in propylene gycol monomethyl ether acetate should be prepared just before use.

When a dialkyl dicarbonate is used as a compound to he reacted with the alkali-soluble polymer having a phenolic hydroxyl or carboxyl group, a base is used as the reaction catalyst, while when a vinyl ether compound is used as a compound to be reacted with the alkali-soluble polymer having a phenolic hydroxyl or carboxyl group, a base is used as the reaction stopper. As these bases, usual bases which are optically decomposable or not decomposable and are used as conventional additives in chemically amplified resists can be preferably used. Examples of these bases include ammonia, organic amines such as triethylamine, dicyclohexyl methylamine, etc.; ammonium hydroxides represented by tetramethylammonium hydroxide (TMAH), sulfonium hydroxides represented by triphenylsulfonium hydroxide, iodonium hydroxides represented by diphenyliodonium hydroxide and conjugated salts of these iodonium hydroxides, such as triphenylsulfonium acetate, triphenylsulfonium camphanate, triphenylsulfonium camphorate etc. These reaction base catalysts or reaction stoppers are preferably those which when formed into a resist composition, do not have influence on resist sensitivity, and in particular, optically decomposable bases are preferable. When the amine is present in the resist composition, attention should be paid because sensitivity may be lowered. Further, inorganic bases are not preferable because many of them contain metal ions that contaminate the substrate such as silicon wafer etc. If the polymer is neither isolated nor purified according to the method for preparing a resist composition of the present invention, the main cause for instability of the polymer in the step of isolation and purification thereof can be eliminated. If a base is used as the reaction stopper, the stability of the polymer is further improved, and even in the case of the polymer having acetate as a protective group, its stability for 2 months or more at room temperature is confirmed.

The conditions for reacting the alkali-soluble polymer having a phenolic hydroxyl or carboxyl group with the vinyl ether compound or the dialkyl dicarbonate may be the same as in the prior art, and the reaction may be conducted under the same conditions as in the prior art. In this reaction, if water is present in the reaction system, the vinyl ether is decomposed to formaldehyde and alcohol, and the degree of protection by the vinyl ether compound becomes lower than the set value. As the drop of the degree of polymer has a significant effect on the thickness loss of the resist film in developer, the moisture content should be minimized in the reaction system preferably. That is, if the moisture content in the reaction system is controlled to be as low as possible, the degree of protection can be in a certain narrow range, to significantly reduce variations in degrees of protection as compared with the conventional reaction. Accordingly, the moisture content of the reaction solution before the reaction should be measured by Karl Fischer method in order to confirm that the moisture content is less than about 5,000 ppm, preferably less than about 1,000 ppm. For example, if the moisture content is more than 5,000 ppm, attention should be paid such that the degree of protection is within a set value, for example by increasing the amount of the vinyl ether compound as necessary. The reaction temperature and reaction time are e.g. 25° C., and 6 hours respectively, but if the protective group is ketal, are e.g. 0° C. and 2 hours respectively.

If a single alkali-soluble polymer is protected by both a vinyl ether compound and a dialkyl dicarbonate, usually the polymer is subjected to protection reaction with the vinyl ether compound in the presence of an acid catalyst and then subjected to protection reaction with the dialkyl dicarbonate in the presence of a base catalyst.

The usable base includes radiation-sensitive bases or usual bases not sensitive to radiation. These bases are not necessarily required for resist formulation, but because their addition can prevent the deterioration of pattern characteristics even in the case where the treatment step is conducted with delay, so their addition is preferable. Further, their addition also results in improvements in clear contrast.

Among radiation-sensitive base compounds suitable as bases, particularly preferable examples include e.g. triphenylsulfonium hydroxide, triphenylsulfonium acetate, triphenylsulfonium phenolate, tris-(4-methylphenyl) sulfonium hydroxide, tris-(4-methylphenyl)sulfonium acetate, tris-(4-methylphenyl)sulfonium phenolate, diphenyliodonium hydroxide, diphenyliodonium acetate, diphenyliodonium phenolate, bis-(4-tert-butylphenyl)iodonium hydroxide, bis-(4-tert-butylphenyl)iodonium acetate, bis-(4-tert-butylpheny)iodonium phenolate etc.

Further, the base compounds not sensitive to radiation include e.g. (a) ammonium salts such as tetramethylammonium hydroxide, tetrabutylammonium hydroxide etc., (b) amines such as n-hexylamine, dodecylamine, aniline, dimethylaniline, diphenylamine, triphenylamine, diazabicyclooctane, diazabicycloundecane etc., and (c) basic heterocyclic compounds such as 3-phenylpyridine, 4-phenylpyridine, lutidine and 2,6-di-tert-butylpyridine.

These base compounds can be used alone or in combination thereof. The amount of the base compound added is determined according to the amount of the photo acid-generating compound and the photo acid-generating ability of the photoacid generator. Usually the base compound is used in a ratio of 10 to 110 mol %, preferably 25 to 95 mole % relative to the amount of the photo acid-generating compound.

Step 8—Neutralization

In this step of the present invention, the step of inactivating the acid catalyst by use of the base is an important step. That is, after the reaction of step 7 is finished, the base (for example triphenylsulfonium acetate or the like) is added whereby the acid catalyst is neutralized and inactivated to stop the reaction, so that a polymer solution having storage stability can be obtained. Theoretically, addition of the base in an equivalent amount to the acid is sufficient to inactivate the acid, but because storage stability can be further secured by adding about 10% excess base, addition of about 1.1 equivalents of the base to 1 equivalent of the acid is preferable. This excess base will be taken into consideration in order to determine the amount of another base added as an additive for preparing the resist.

It is also feasible in this neutralization step to use an ion exchange material as previously mentioned herein before.

Step 9—Photoacid Generator Addition

The resist composition is prepared without isolating the resist material by directly adding to the resist material solution (prepared as described above) a photoacid generating compound capable of generating an acid upon exposure to actinic radiation (photoacid generator) and if necessary a base and additives for improvement of optical and mechanical characteristics, a film forming property, adhesion with the substrate, etc. optionally in the form of a solution. The viscosity of the composition is regulated by addition of solvent, if necessary. The solvent used in preparing the resist composition is not necessarily limited to the type of third solvent having been used in step 6, and it is possible to use any other solvent which is conventionally used in preparation of a resist composition. Further, any photo acid-generating compounds and other additives, which are used conventionally in chemically amplified resists, can also be used. The total solid content in the resist composition is preferably in the range of 9 to 50% by weight, more preferably 15 to 25% by weight, relative to the solvent.

The photoacid generator is a compound capable of generating an acid upon exposure to high energy radiation. Preferred photoacid generators are sulfonium salts, iodonium salts, sulfonyldiazomethanes, and N-sulfonyloxyimides. These photoacid generators are illustrated below while they may be used atone or in admixture of two or more.

Sulfonium salts are salts of sulfonium cations with sulfonates. Exemplary sulfonium cations include triphenylsulfonium, (4-tert-butoxyphenyl)diphenylsulfonium, bis(4-tert-butoxy-phenyl)phenylsulfonium, tris(4-tert-butoxyphenyl)sulfonium, (3-tert-butoxyphenyl)diphenylsulfonium, bis(3-tert-butoxyphenyl)phenylsulfonium, tris (3-tert-butoxyphenyl)sulfonium, (3,4-di-tert-butoxyphenyl) diphenylsulfonium, bis(3,4-di-tert-butoxyphenyl) phenylsulfonium, tris(3,4-di-tert-butoxyphenyl)sulfonium, diphenyl(4-thiophenoxyphenyl)sulfonium, (4-tert-butoxycarbonyl-methyloxyphenyl)diphenylsulfonium. tris(4-tert-butoxycarbonylmethyloxyphenyl)sulfonium, (4-tert-butoxyphenyl)bis(4-dimethylaminophenyl)sulfonium tris(4-dimethylaminophenyl)sulfonium, 2-naphthyldiphenylsulfonium, dimethyl-2-naphthylsulfonium, 4-hydroxyphenyldimethylsulfonium, 4-methoxyphenyl-dimethylsulfonium, trimethylsulfonium, 2-oxocyclohexylcyclohexyl-methylsulfonium, trinaphthylsulfonium, and tribenzylsulfonium. Exemplary sulfonates include trifluoromethanesulfonate, nonafluorobutanesulfonate, heptadecafluorooctanesulfonate, 2,2,2-trifluorooethanesulfonate, pentafluorobenzenesulfonate, 4-trifluoromethylbenzenesulfonate, 4-fluorobenzenesulfonate, toluenesulfonate, benzenesulfonate, 4,4-toluenesulfonyloxybenzenesulfonate, naphthalenesulfonate, camphorsulfonate, octanesulfonate, dodecylbenzenesulfonate, butanesulfonate, and methanesulfonate. Sulfonium salts based on combination of the foregoing examples are included.

Iodonium salts are salts of iodonium cations with sulfonates. Exemplary iodinium cations are arytiodonium cations including diphenyliodinium, bis(4-tert-butylphenyl)iodonium, 4-tert-butoxyphenylphenyliodonium, and 4-methoxyphenylphenylodonium. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, 4,4-toluenesulfonyloxy-benzenesulfonate, naphthalenesulfonate, camphorsulfonate, octanesulfonate, dodecylbenzenesulfonate, butanesulfonate, and methanesulfonate. Iodonium salts based on combination of the foregoing examples are included.

Exemplary sulfonyldiazomethane compounds include bissulfonyldiazomethane compounds and sulfonylcarbonyldiazomethane compounds such as bis(ethylsulfonyl)diazomethane, bis(1-methylpropylsulfonyl)diazomethane, bis(2-methylpropylsulfonyl)diazomethane, bis(1,1-dimethylethylsulfonyl)diazomethane, bis (cyclohexylsulfonyl)diazomethane, bis (perfluoroisopropylsulfonyl)diazomethane, bis (phenylsulfonyl)diazomethane, bis(4-methylphenylsulfonyl)diazomethane, bis(2,4-dimethylphenylsulfonyl)diazomethane, bis(2-naphthylsulfonyl)diazomethane, 4-methylphenylsulfonylbenzoyldiazomethane, tert-butylcarbonyl-4-methylphenylsulfonyldiazomethane 2-naphthylsulfonylbenzoyldiazomethane, 4-methylphenyl-sulfonyl-2-naphthoyldiazomethane, methylsulfonylbenzoyldiazomethane, and tert-butoxycarbonyl-4-methylphenylsulfonyldiazotmethane.

N-sulfonyloxyimide photoacid generators include combinations of imide skeletons with sulfonates. Exemplary imide skeletons are succinimide, naphthalene dicarboxylic acid imide, phthalimide, cyclohexyldicarboxylic acid imide, 5-norbornene-2,3-dicarboxylic acid imide, and 7-oxabicyclo[2,2,1]-5-heptene-2,3-dicarboxylic acid imide. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate, Benzoinsulfonate photoacid generators include benzoin tosylate, benzoin mesylate, and benzoin butanesulfonate.

Pyrogallol trisulfonate photoacid generators include pyrogallol, fluoroglycine, catechol, resorcinol, hydroquinone, in which all the hydroxyl groups are replaced by trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate.

Nitrobenzyl sulfonate photoacid generators include 2,4-dinitrobenzyl sulfonate, 2-nitrobenzyl sulfonate, and 2,6-dinitrobenzyl sulfonate, with exemplary sulfonates including trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate. Also useful are analogous nitrobenzyl sulfonate compounds in which the nitro group on the benzyl side is replaced by a trifluoromethyl group.

Sulfone photoacid generators include bis(phenylsulfonyl)methane, bis(4-methylphenylsulfonyl)methane, bis(2-naphthylsulfonyl)methane, 2,2-bis(phenylsulfonyl)propane, 2,2-bis(4-methylphenylsulfonyl)propane, 2,2-bis(2-naphthylsulfonyl)propane, 2-methyl-2-(p-toluenesulfonyl)propiophenone, 2-cyclohexylcarbonyl-2-(p-toluenesulfonyl)propane, and 2,4-dimethyl-2-(p-toluenesulfonyl)pentan-3-one.

Photoacid generators in the form of glyoxime derivatives include bis-o-(p-toluenesulfonyl)-α-dimethylglyoxime, bis-o-(p-toluenesulfonyl)-α-diphenylglyoxime, bis-o-(p-toluenesulfonyl)-α-dicyclohexylglyoxime, bis-o-(p-toluenesulfonyl)-2,3-pentanedioneglyoxime, bis-o-(p-toluenesulfonyl)-2-methyl-3,4-pentanedioneglyoxime, bis-o-(n-butanesulfonyl)-α-dimethylglyoxime, bis-o-(n-butanesulfonyl)-α-diphenylglyoxime, bis-o-(n-butanesulfonyl)-α-dicyclohexylglyoxime, bis-o-(n-butanesulfonyl)-2,3-pentanedioneglyoxime, bis-o-(n-butanesulfonyl)-2-methyl-3,4-pentanedioneglyoxime, bis-o-(methanesulfonyl)-α-dimethylglyoxime, bis-o-(trifluoromethanesulfonyl)-α-dimethylglyoxime, bis-o-(1,1,1-trifluoroethanesulfonyl)-α-dimethylglyoxime, bis-o-(tert-butanesulfonyl)-α-dimethylglyoxime, bis-o-(perfluorooctanesulfonyl)-α-dimethylglyoxime, bis-o-(cyclohexylsulfonyl)-α-dimethylglyoxime, bis-o-(benzenesulfonyl)-α-dimethylglyoxime, bis-o-(p-fluorobenzenesulfonyl)-α-dimethylglyoxime, bis-o-(p-tert-butylbenzenesulfonyl)-α-dimethylglyoxime, bis-o-(xylenesulfonyl)-α-dimethylglyoxime, and bis-o-(camphorsulfonyl)-α-dimethylglyoxime.

Of these photoacid generators, the sulfonium salts, bis-sulfonyldiazomethane compounds, and N-sulfonyloxyimide compounds are preferred.

While the anion of the optimum acid to be generated differs depending on the ease of scission of acid labile groups introduced in the polymer, an anion which is non-volatile and not extremely diffusive is generally chosen. The preferred anions include benzenesulfonic acid anions, toluenesulfonic acid anions, 4,4-toluenesulfonyloxybenzenesulfonic acid anions, pentafluorobenzenesulfonic acid anions, 2,2,2-trifluoroethanesulfonic acid anions, nonafluorobutanesulfonic acid anions, heptadecafluorooctanesulfonic acid anions, and camphorsulfonic acid anions.

In the chemically amplified positive resist composition, an appropriate amount of the photoacid generator is 0 to 20 parts, and especially 1 to 10 parts by weight per 100 parts by weight of the solids in the composition. The photoacid generators may be used alone or in a mixture of two or more. The transmittance of the resist film can be controlled by using a photoacid generator having a low transmittance at the exposure wavelength and adjusting the amount of the photoacid generator added.

In conjunction with the all steps set forth above, it is critical that all steps be conducted on an anhydrous basis, i.e. wherein the water level is less than about 5,000 parts per million (ppm), in order to avoid possible side reactions and provide a mechanism to provide a convenient and direct route to a resist composition without having to isolate the polymer product and then carry out additional processing steps.

It is to be understood that in conjunction with the purification steps 2 and 4, set forth above, it is within the scope of this invention to use both of these steps, only one of these steps or neither of these steps.

This invention is further illustrated by the following examples that are provided for illustration purposes and in no way limits the scope of the present invention.

EXAMPLES

General

In the Examples that follow, the following abbreviations are used:
ASM—p-Acetoxystyrene monomer
t-BPP—tert-butyl peroxypivalate
THF—Tetrahydrofuran
GPC—Gel permeation chromatography
GC—Gas chromatography
FTIR—Fourier transform infrared spectroscopy
NMR—Nuclear magnetic resonance spectroscopy, usually of either proton, $^1H$; and/or carbon 13, $^{13}C$ nuclei.
DSC—Differential scanning calorimetry
UV-Vis—Ultraviolet-Visible Spectroscopy General Analytical Techniques Used for the Characterization: A variety of analytical techniques were used to characterize the co- and terpolymers of the present invention that included the following:

NMR: $^1H$ and $^{13}C$ NMR spectra were recorded on a Bruker 400 MHz spectrometer with 5 mm probes at 400 and 100 MHz, respectively.

GPC: GPC was performed on a Waters gel permeation chromatograph equipped with refractive index detection.

GC: GC analysis was performed on a Hewlett Packard Model 5890 series II gas chromatograph equipped with a DB-1 column.

FTIR: FTIR was recorded on a Mattson Genesis Series FTIR.

DSC: A Perkin Elmer 7700 DSC was used to determine the $T_g$ (glass transition temperature) of the co- and terpolymers of this invention. The heating rate was maintained at 10°

C./minute, generally, over a temperature range of 50° C. to 400° C. The flow rate of nitrogen or air is maintained at 20 mL/min.

UV-Vis of samples were taken using a Hewlett Packard Vectra 486/33VL UV-Vis spectrophotometer.

Example 1

Poly(4-hydroxystyrene) in Propyleneglycolmonomethyl Ether Acetate

To a four neck 12 liter flask, fitted with a mechanical stirrer, condenser, nitrogen inlet and thermowell, 4-acetoxystyrene (2752.3 g, 16.97 moles), and methanol (3075.0 g) were added. The flask was purged with nitrogen and then heated to reflux (66° C.) over a period of one hour. Then, 2,2'-azobis(2,4-dimethylvaleronitrile) (146.0 g, 0.59 moles) was added to the hot reactor as a slurry in methanol (250 g). The reactor was heated at reflux for 2 hours and then an additional charge of 2,2'-azobis(2,4-dimethylvaleronitrile) (24.3 g, 0.1 moles) was done. The reactor was heated for an additional 6 hours and then was cooled to room temperature.

The solids were extract by successive replacements of the solvent as follows. The reactor was heated to 60° C. with stirring. The heat was removed and the reactor was allowed to cool without stirring to 44.3° C. The top layer (899 g) of solvent was removed by suction and was replaced with methanol (1495 g). The reactor was again heated to 60° C. and cooled to 41.9° C. without stirring. The top layer (1700 g) was again removed by suction and was replaced with methanol (1705 g). The reactor was again heated to 60° C. and cooled to 46.2° C. without stirring. The top layer (1633 g) was again removed by suction and was replaced with methanol (1765 g). The reactor was again heated to 60° C. and cooled to 45.0° C. without stirring. The top layer (1905 g) was again removed by suction and was replaced with methanol (1955 g). The reactor was again heated to 60° C. and cooled to 46.0° C. without stirring. The top layer (2145 g) was again removed by suction and was replaced with methanol (2215 g). The reactor was again heated to 60° C. and cooled to 46.0° C. without stirring. The top layer (2241 g) was again removed by suction and was replaced with methanol (1700 g). All of the solids during each extraction were analyzed for molecular weight by GPC, table I. The reactor was then cooled to room temperature.

The purified poly(4-acetoxystyrene) was converted to poly(4-hydroxystyrene) as follows. The reactor was fitted with a Dean Stark trap and condenser. A solution of 25.0 weight percent of Sodium methoxide in methanol (64.24 g, 0.30 moles) was added to the reactor. The reactor was then heated to reflux (64° C.). The overhead distillate was removed and replaced with methanol with equal weight. The reactor was heat at reflux for 7.5 hours. The reactor was then cooled to room temperature. This solution was then passed through a column of Amberlyst A15 (2"×16") at 40 mL/min at room temperature to remove the catalyst and thus avoid metal contamination.

The solvent was exchanged from methanol to propyleneglycolmonomethyl ether acetate (PGMEA) as follows. The solution was added to a 4 neck, 12 liter flask fitted with a distillation head and receiver, thermowell, mechanical stirrer, and nitrogen inlet. The reactor was heated to 25° C. to 48° C. under vacuum (120 torr to 10 torr) to remove methanol. To the reactor, a total of 4975 g a PGMEA was added as the methanol was removed. The amount of solids present was determined by density and the solution was adjusted to 35.0 weight percent with PGMEA. An overall yield of 1634 g of polymer (81.7% theoretical yield) was obtained.

Example 2

Poly(4-hydroxystyrene) in Propyleneglycolmonomethyl Ether Acetate

To a four neck 12 liter flask, fitted with a mechanical stirrer, condenser, nitrogen inlet and thermowell, 4-acetoxystyrene (2752.3 g, 16.97 moles), and methanol (3081.0 g) were added. The flask was purged with nitrogen and then heated to reflux (66° C.) over a period of one hour. Then, 2,2'-azobis(2,4-dimethylvaleronitrile) (146.1 g, 0.59 moles) was added to the hot reactor as a slurry in methanol (250 g). The reactor was heated at reflux for 2 hours and then an additional charge of 2,2'-azobis(2,4-dimethylvaleronitrile) (24.4 g, 0.01 moles) was done. The reactor was heated for an additional 6 hours and then was cooled to room temperature.

The solids were extracted by successive replacements of the solvent as follows. The reactor was heated to 60° C. with stirring. The heat was removed and the reactor was allowed to cool without stirring to 45.0° C. The top layer (1129 g) of solvent was removed by suction and was replaced with methanol (1817 g). The reactor was again heated to 60° C. and cooled to 47.0° C. without stirring. The top layer (1627 g) was again removed by suction and was replaced with methanol (1624 g). The reactor was again heated to 60° C. and cooled to 44.0° C. without stirring. The top layer (1668 g) was again removed by suction and was replaced with methanol (1613 g). The reactor was again heated to 60° C. and cooled to 47.0° C. without stirring. The top layer (1514 g) was again removed by suction and was replaced with methanol (1745 g). The reactor was again heated to 60° C. and cooled to 45.0° C. without stirring. The top layer (1822 g) was again removed by suction and was replaced with methanol (2288 g). The reactor was again heated to 60° C. and cooled to 43.0° C. without stirring. The top layer (22471 g) was again removed by suction and was replaced with methanol (1607 g). All of the solids during each extraction were analyzed for molecular weight by GPC, table 1. The reactor was then cooled to room temperature.

The purified poly(4-acetoxystyrene) was converted to poly(4-hydroxystyrene) as follows. The reactor was fitted with a Dean Stark trap and condenser. A solution of 25.0 weight percent of Sodium methoxide in methanol (64.24 g 0.30 moles) was added to the reactor. The reactor was then heated to reflux (64° C.). The overhead distillate was removed and replaced with methanol with equal weight The reactor was heat at reflux for 7.5 hours. The reactor was then cooled to room temperature. This solution was then passed through a column of Amberlyst A15 (2"×16") at 40 mL/min at room temperature to remove metal contamination.

The solvent was exchanged from methanol to propyleneglycolmonomethyl ether acetate (PGMEA) as follows. The solution was added to a 4 neck, 12 liter flask fitted with a distillation head and receiver, thermowell, mechanical stirrer, and nitrogen inlet. The reactor was heated to 25° C. to 48° C. under vacuum (120 torr to 10 torr) to remove methanol. To the reactor, a total of 4000 g PGMEA was added as the methanol was removed. The amount of solids present was determined by density and the solution was adjusted to 35.0 weight percent with PGMEA. An overall yield of 1708 g of polymer (85.4% theoretical yield) was obtained.

TABLE 1

Molecular weight analysis of poly(4-acetoxystyrene) purification by extraction.

| | Example 1 | | | Example 2 | | |
|---|---|---|---|---|---|---|
| Sample | Weight average Molecular Weight | Number average Molecular Weight | Polydispersity | Weight average Molecular Weight | Number average Molecular Weight | Polydispersity |
| Original solid | 9,556 | 5,083 | 1.88 | 8,866 | 4,501 | 1.97 |
| 1st extraction | 9,845 | 5,594 | 1.76 | 9,830 | 5,093 | 1.93 |
| 2nd extraction | 10,009 | 5,888 | 1.70 | 10,049 | 5,742 | 1.75 |
| 3rd extraction | 10,371 | 6,285 | 1.65 | 10,112 | 5,879 | 1.72 |
| 4th extraction | 9,921 | 6,162 | 1.61 | 10,327 | 5,969 | 1.73 |
| 5th extraction | 10,362 | 6,476 | 1.60 | 9,394 | 5,559 | 1.69 |

Example 3

Poly (hydroxystyrene-co-ethoxyethoxystyrene)

To a 3L 4 neck round bottom flask containing 1.30 kg, 34.5 wt. % polyhydroxystyrene solution in PGMEA, camphoresulphonic acid, 400 mg was added under nitrogen atmosphere and the mixture was stirred at 23° C. for 2 hours for homogeneity. The solution was then cooled to 5° C. and 127 g, ethylvinylether was added drop wise with stirring under nitrogen at the reaction temperature between 5° C. to 10° C. (2 hours). After the addition, the mixture was stirred for additional 6 hours at 5° C. Amberlyst A-21, 33 g which was pretreated with PGMEA was added to the reaction mixture and stirred for 2 hours at 25° C. The resin was removed by filtration and 1.43 kg, 39.3% poly (hydroxystyrene-co-ethoxyethoxystyrene) copolymer solution was obtained. The characterization of the copolymer and the ratio determination were done by NMR. Hydroxystyrene/ethoxyethoxystyrene ratio was determined to be 60/40, molecular weight was determined by GPC (polystyrene standard) to be Mw=10,819 with the polydispersity 1.77.

Example 4

Poly (hydroxystyrene-co-t-butoxycarbonyloxystyrene)

To a 2L round bottom flask containing 1.03 kg, 35.1 wt 1% polyhydroxystyrene solution in PGMEA, p-dimethlyaminopyridine, 0.72 g in 11 g PGMEA was added under nitrogen and the mixture was stirred at 23° C. for one hour. Di-t-butyl dicarbonate, 124.4 g was added to the solution at 23° C. and stirred under nitrogen for 6 hours at 23° C. Vacuum was applied to the solution at 20 mmHg with stirring for 1 hour at 23° C. for removal of carbon dioxide formed as a by-product in the solution. Dowex Mac-3, 30 g which was pretreated with PGMEA was added to the reaction mixture and stirred for 2 hours at 23° C. The resin was removed by filtration and 1.14 kg, 36.6 wt. % poly (hydroxystyrene-co-t-butoxycarbonyloxystyrene) copolymer solution was obtained. The characterization of the copolymer and the ratio determination were done by NMR. Hydroxystyrene/t-butoxycarbonyloxystyrene ratio was determined to be 82/18, molecular weight was determined by GPC to be Mw=11,711 with polydispersity 1.67.

Example 5

The following example illustrates the use of step 4—purification of this invention on the purification of a terpolymer of 4-hydroxystyrene/styrene/tert-butyl acrylate (80/10/10). /8467 g 4-acetoxystyrene, 685 g styrene, and 829 g tert-butyl acrylate was polymerized in 11870 g methanol using 982 g tert-butyl peroxypivalate as a catalyst. A sample of the polymer was isolated for analytical purposes. The remainder was treated with 154 g sodium methoxide and the resulting methyl acetate was removed by distillation. A second sample was removed for analysis. Heptanes, 5030 g, were added and a second layer was noted. The mixture was heated at refluxing temperature for 2 hours and then allowed to cool. The heptanes were separated and were removed by decantation. Heptanes, 4.7 kg, were added and the mixture was again heated to refluxing temperatures for 3 hours and allowed to cool. The procedure was repeated a third time with 3.57 kg heptanes. After removal of the heptanes layer, the methanol solution was distilled to remove the remaining heptanes and the solution was passed over a column of Amberlyst 15 to remove all traces of metal ions. A small portion of the polymer was isolated by precipitation with water and dried under reduced pressure with a nitrogen purge. The $T_g$=159.4° C. The remaining polymer was treated as set forth in Example 1.

Example 6

The procedure of Example 5 was repeated except that no heptanes extraction was used prior to precipitation of the resin. In that instance, the $T_g$=150.7° C.

Example 7

The following example illustrates the use of step 4 of this invention on the purification of a terpolymer of 4-hydroxystyrene/styrene/tert.-butyl acrylate (75/15/10). 1680 g 4-acetoxystyrene, 217 g styrene, 175 g, tert-butyl acrylate in 2464 g methanol and 300 g tetrahydrofuran were polymerized with 280 g VAZO 52 (DuPont). A sample of the polymer was isolated for analytical purposes. The remainder was treated with 30.5 g sodium methoxide and the resulting methyl acetate was removed by distillation. A second sample was removed for analysis. The $T_g$=146.9° C. Heptanes, 1.2 kg, were added and a second layer was noted. The mixture was heated at refluxing temperature for 2 hours and then allowed to cool. A second layer did not form and additional 1.1 kg heptanes were added. The mixture was heated to refluxing temperature and then allowed to cool. A total of 1.4 kg of heptanes were removed by decantation. Heptanes, 1.4 kg were added to the methanol solution and the mixture was heated to refluxing temperature for 2 hours and allowed to cool. Heptanes, 1.7 kg, were removed by decantation and replaced by 1.7 kg fresh heptanes. The mixture was heated to refluxing temperature for 2 hours and allowed to cool. The heptanes layer was removed by decantation and the methanol solution was boiled to remove the remaining heptanes.

A sample of the polymer was isolated by precipitation with water and dried under reduced pressure with a nitrogen purge. The $T_g$=152.3° C. The remaining polymer was treated as set forth in Example 1.

Example 8

The following example illustrates the use of step 4 of this invention on the purification of a terpolymer of 4-hydroxystyrene/styrene/tert-butyl acrylate (55/25/20) and extraction of the purified terpolymer into ethyl lactate. 1443.4 g 4-acetoxystyrene, 424.3 g styrene, 411.0 g, tert-butyl acrylate in 2279 g methanol were polymerized with 244.0 g tert-butyl peroxypivalate. Transesterification was accomplished with 26.7 g sodium methoxide in 774 g of methanol. The metal ions were removed using Amberlyst 15 resin to prepare a methanolic solution of the polymer. A sample was removed for analysis. The $T_g$=132.6° C. The solution was extracted three times with heptanes: (1) 3323 g heptanes were added and the mixture was stirred for 30 minutes then allowed to stand 30 minutes. The heptanes layer (2553 g) was removed and (2) replaced with 3345 g. of fresh heptanes. The mixture was stirred for 30 minutes and allowed to stand for 30 minutes. The heptanes layer (3755 g) was removed and (3) replaced with 3316 g fresh heptanes. The mixture was stirred for 30 minutes and allowed to stand 30 minutes. The heptanes layer (3678 g.) was removed and the methanol layer was distilled to remove the remaining heptanes. A second sample was removed for analysis. The $T_g$=139.5° C. Ethyl lactate, 1119.36 g, was added and the whole subjected to vacuum distillation at 370-380 torr. When the pot temperature reached 48.7° C. (overhead temperature of 32° C.), an additional 743.72 g of ethyl lactate was added, distillation was resumed until the pot temperature reached 73.1° C. (overhead temperature of 43%.) An additional 727.29 g of ethyl lactate was added and the distillation was resumed until the pot temperature reached 81.2° C. (overhead temperature of 49° C.).

Example 9

The following example illustrates the use of step 4 of this invention on the purification of a copolymer of 4-hydroxystyrene/tert-butyl acrylate (75/25). 1048 g 4-acetoxystyrene, 272 g, tert-butyl acrylate in 1578 g methanol were polymerized with 63.2 g VAZO 52 (DuPont). A sample of the polymer was isolated for analytical purposes. The remainder was treated with 19.0 g sodium methoxide and the resulting methyl acetate was removed by distillation. A second sample was removed for analysis. The $T_g$=138.6° C. Heptanes, 823 g, were added and a second layer was noted. The mixture was stirred at room temperature for 1 hr and then allowed to stand for 1 hr. A total of 475 g of heptanes was removed by decantation and replaced by 838 g of fresh heptanes. The mixture was again stirred at room temperature for 1 hr and then allowed to stand for 1 hr. A total of 929 g of heptanes were removed by decantation and replaced by 8343 g of fresh heptanes. A total of 1008 g of heptanes were removed by decantation. The methanol solution was boiled to remove the remaining heptanes. A sample of the polymer was isolated by precipitation with water and dried under reduced pressure with a nitrogen purge. The $T_g$=144.7° C. The remaining polymer was treated as set forth in Example 1.

Example 10

The following example illustrates the use of step 4 of this invention on the purification of commercially available poly(4-hydroxystyrene). The initial sample had a $T_g$=165.3° C. A solution of 250 g of poly(4-hydroxystyrene) in 583 g of methanol was extracted three times with heptanes, (1) 343 g heptanes were added and the mixture was stirred for 30 minutes then allowed to stand 30 minutes. The heptanes layer (289 g) was removed and (2) replaced with 352 g of fresh heptanes. The mixture was stirred for 30 minutes and allowed to stand for 30 minutes. The heptanes layer (324 g) was removed and (3) replaced with 348 g fresh heptanes. The mixture was stirred for 30 minutes and allowed to stand 30 minutes. The heptanes layer (364 g) was removed and the methanol layer was distilled to remove the remaining heptanes. A sample of the polymer was isolated by precipitation with water and dried under reduced pressure with a nitrogen purge. The $T_g$=172.6° C. The remaining polymer was treated as set forth in Example 1.

While specific reaction conditions, reactants, and equipment are described above to enable one skilled in the art to practice the invention, one skilled in the art will be able to make modifications and adjustments which are obvious extensions of the present inventions. Such obvious extensions of or equivalents to the present invention are intended to be within the scope of the present inventions, as demonstrated by the claims which follow.

What is claimed is:

1. A liquid phase process for preparing an anhydrous and pure hydroxyl containing polymer in solution and which comprises the steps of:
   (A) polymerizing a monomer or monomers selected from the group consisting of (1) substituted styrenes and (2) substituted styrenes and (3) an alkyl acrylates, and/or (4) ethylenically unsaturated co-polymerizable monomer or monomers, and (5) mixtures thereof in a first solvent in the presence of an initiator for a sufficient period of time of at least one minute and at a temperature of from about 30 C to about 100 C to form a polymer and first solvent mixture;
   (B) purifying the polymer and first solvent mixture by fractionation wherein additional first solvent is added to said mixture, said mixture is heated up to no higher than the boiling point of said first solvent and/or stirred for at least one minute, the mixture is allowed to settle, the first solvent is decanted, and further first solvent is added, and repeating this fractionation at least once more, and whereby the polydispersity of said polymer remaining is 2.0 or below;
   (C) transesterifying said purified mixture of step (B) wherein said mixture is refluxed at the boiling point of said first solvent in the presence of a catalyst for a period of time of at least one minute and at a temperature of from about 50 C to about 200 C to form a reaction mixture containing a hydroxyl containing polymer and first solvent;
   (D) purifying said reaction mixture from step (C) wherein a second solvent is mixed with said reaction mixture wherein the polymer is insoluble in said second solvent and the impurities are soluble in said second solvent, and allowing the layers of polymer and mixed solvents to separate, and removing a portion of said solvent mixture and any dissolved impurities and low weight average molecular weight polymers dissolved therein, and then adding additional first solvent to resolubilize said polymer therein;
   (E) passing said purified reaction mixture of step (D) through an ion exchange material in order to remove any catalyst therefrom and thus provide a substantially catalyst-free hydroxyl containing polymer solution;
   (F) adding a third solvent, which is photoresist or photosensitive coating compatible, to said hydroxyl containing polymer solution from step (E) and then distilling off the first solvent at a temperature of at least the boiling point of said first solvent for a sufficient period of time in order to remove substantially all of said first solvent to provide a substantially pure hydroxyl containing polymer in solution in said third solvent.

2. The process as set forth in claim 1 wherein the second solvent is selected from the group consisting of hexane, heptanes, octane, petroleum ether, lower alkyl halohydrocarbons and mixtures thereof.

3. The process as set forth in claim 2 wherein the second solvent is heptanes and said third solvent is a photoresist compatible solvent.

4. The process as set forth in claim 1 wherein there is an additional step after step (F), wherein the substantially pure hydroxyl containing polymer in solution is subjected to acetalization wherein said hydroxyl containing polymer solution is reacted with a vinyl either in the presence of an acid catalyst for a sufficient period of time and at a sufficient temperature and pressure to form an acetal derivatized hydroxyl containing polymer in solution.

5. The process as set forth in claim 4 wherein there is an additional step after the formation of the acetal derivatized hydroxyl containing polymer in solution, wherein said solution is neutralized, in a neutralization step, in order to eliminate the acidity thereof.

6. The process as set forth in claim 5 wherein there is an additional step after the neutralization step, wherein there is added to said neutralized acetal derivatized hydroxyl containing polymer in solution, a photoacid generator in order to directly produce a chemically amplified resist composition in solution.

7. The process as set forth in claim 1 wherein the monomer is acetoxystyrene monomer, or an acrylate monomer, or mixtures thereof.

8. A liquid phase process for preparing an anhydrous and pure hydroxyl containing polymer in solution and which comprises the steps of:
(A) polymerizing a monomer or monomers selected from the group consisting of (1) substituted styrenes and (2) substituted styrenes and (3) alkyl acrylates and/or (4) ethylenically unsaturated co-polymerizable monomer or monomers, and (5) mixtures thereof, in a first solvent in the presence of an initiator for a sufficient period of time of at least one minute and at a temperature of from about 30 C to about 100 C to form a polymer and first solvent mixture;
(B) transesterifying said mixture of step (A) wherein said mixture is refluxed at the boiling point of said first solvent in the presence of a catalyst for a period of time of at least one minute and at a temperature of from about 50 C to about 200 C to form a reaction mixture containing a hydroxyl containing polymer and first solvent;
(C) purifying said reaction mixture from step (B) wherein a second solvent is mixed with said reaction mixture wherein the polymer is insoluble in said second solvent and the impurities are soluble in said second solvent, and allowing the layers of polymer and mixed solvents to separate, and removing a portion of said solvent mixture and any dissolved impurities and low weight average molecular weight polymers dissolved therein, and then adding additional first solvent to resolubilize said polymer therein;
(D) passing said purified reaction mixture of step (C) through an ion exchange material in order to remove any catalyst therefrom and thus provide a substantially catalyst-free hydroxyl containing polymer solution;
(E) adding a third solvent, which is photoresist or photosensitive coating compatible, to said hydroxyl containing polymer solution from step (D) and then distilling off the first solvent at a temperature of at least the boiling point of said first solvent for a sufficient period of time in order to remove substantially all of said first solvent to provide a substantially pure hydroxyl containing polymer in solution in said third solvent.

9. The process as set forth in claim 8 wherein the polymer produced in step A is at least about 40% by weight soluble in said first solvent.

10. The process as set forth in claim 8 wherein the second solvent is selected from the group consisting of hexane, heptanes, octane, petroleum ether, lower alkyl halohydrocarbons and mixtures thereof.

11. The process as set forth in claim 10 wherein the second solvent is heptanes and said third solvent is a photoresist compatible solvent.

12. The process as set forth in claim 8 wherein there is an additional step after step (E), wherein the substantially pure hydroxyl containing polymer in solution is subjected to acetalization wherein said hydroxyl containing polymer solution is reacted with a vinyl either in the presence of an acid catalyst for a sufficient period of time and at a sufficient temperature and pressure to form an acetal derivatized hydroxyl containing polymer in solution.

13. The process as set forth in claim 12 wherein there is an additional step after the formation of the acetal derivatized hydroxyl containing polymer in solution, wherein said solution is neutralized, in a neutralization step, in order to eliminate the acidity thereof.

14. The process as set forth in claim 13 wherein there is an additional step after the neutralization step, wherein there is added to said neutralized acetal derivatized hydroxyl containing polymer in solution, a photoacid generator in order to directly produce a chemically amplified resist composition in solution.

15. The process as set forth in claim 8 wherein the monomer is acetoxystyrene monomer, or an acrylate monomer, or mixtures thereof.

16. A liquid phase process for preparing an anhydrous and pure hydroxyl containing polymer in solution and which comprises the steps of:
(A) polymerizing a monomer or monomers selected from the group consisting of (1) substituted styrenes and (2) substituted styrenes and (3) alkyl acrylates and/or (4) ethylenically unsaturated co-polymerizable monomer or monomers, and (5) mixtures thereof, in a first solvent in the presence of an initiator for a sufficient period of time of at least one minute and at a temperature of from about 30 C to about 100 C to form a polymer and first solvent mixture;
(B) purifying said reaction mixture from step (A) wherein a second solvent is mixed with said reaction mixture wherein the polymer is insoluble in said second solvent and the impurities are soluble in said second solvent, and allowing the layers of polymer and mixed solvents to separate, and removing a portion of said solvent mixture and any dissolved impurities and low weight average molecular weight polymers dissolved therein, and then adding additional first solvent to resolubilize said polymer therein;
(C) transesterifying said mixture of step (B) wherein said mixture is refluxed at the boiling point of said first solvent in the presence of a catalyst for a period of time of at least one minute and at a temperature of from about 50 C to about 200 C to form a reaction mixture containing a hydroxyl containing polymer and first solvent;

(D) passing said purified reaction mixture of step (C) through an ion exchange material in order to remove any catalyst therefrom and thus provide a substantially catalyst-free hydroxyl containing polymer solution;

(E) adding a third solvent, which is photoresist or photosensitive coating compatible, to said hydroxyl containing polymer solution from step (D) and then distilling off the first solvent at a temperature of at least the boiling point of said first solvent for a sufficient period of time in order to remove substantially all of said first solvent to provide a substantially pure hydroxyl containing polymer in solution in said third solvent.

17. The process as set forth in claim 16 wherein the polymer produced in step A is at least about 40% by weight soluble in said first solvent.

18. The process as set forth in claim 16 wherein the second solvent is selected from the group consisting of hexane, heptanes, octane, petroleum ether, lower alkyl halohydrocarbons and mixtures thereof.

19. The process as set forth in claim 18 wherein the second solvent is heptanes and said third solvent is a photoresist compatible solvent.

20. The process as set forth in claim 16 wherein there is an additional step after step (E), wherein the substantially pure hydroxyl containing polymer in solution is subjected to acetalization wherein said hydroxyl containing polymer solution is reacted with a vinyl either in the presence of an acid catalyst for a sufficient period of time and at a sufficient temperature and pressure to form an acetal derivatized hydroxyl containing polymer in solution.

21. The process as set forth in claim 20 wherein there is an additional step after the formation of the acetal derivatized hydroxyl containing polymer in solution, wherein said solution is neutralized, in a neutralization step, in order to eliminate the acidity thereof.

22. The process as set forth in claim 21 wherein there is an additional step after the neutralization step, wherein there is added to said neutralized acetal derivatized hydroxyl containing polymer in solution, a photoacid generator in order to directly produce a chemically amplified resist composition in solution.

23. The process as set forth in claim 16 wherein the monomer is acetoxystyrene monomer, or an acrylate monomer, or mixtures thereof.

24. A liquid phase process for preparing an anhydrous and pure hydroxyl containing polymer in solution and which comprises the steps of:

(A) polymerizing a monomer or monomers selected from the group consisting of (1) substituted styrenes and (2) substituted styrenes and (3) alkyl acrylates and/or (4) ethylenically unsaturated co-polymerizable monomer or monomers, and (5) mixtures thereof, in a first solvent in the presence of an initiator for a sufficient period of time of at least one minute and at a temperature of from about 30 C to about 100 C to form a polymer and first solvent mixture;

(B) purifying said reaction mixture from step (A) wherein a second solvent is mixed with said reaction mixture wherein the polymer is insoluble in said second solvent and the impurities are soluble in said second solvent, and allowing the layers of polymer and mixed solvents to separate, and removing a portion of said solvent mixture and any dissolved impurities and low weight average molecular weight polymers dissolved therein, and then adding additional first solvent to resolubilize said polymer therein;

(C) transesterifying said mixture of step (B) wherein said mixture is refluxed at the boiling point of said first solvent in the presence of a catalyst for a period of tune of at least one minute and at a temperature of from about 50 C to about 200 C to form a reaction mixture containing a hydroxyl containing polymer and first solvent;

(D) passing said purified reaction mixture of step (C) through an ion exchange material in order to remove any catalyst there from and thus provide a substantially catalyst-free hydroxyl containing polymer solution;

(E) adding a third solvent, which is photoresist or photosensitive coating compatible, to said hydroxyl containing polymer solution from step (D) and then distilling off the first solvent at a temperature of at least the boiling point of said first solvent for a sufficient period of time in order to remove substantially all of said first solvent to provide a substantially pure hydroxyl containing polymer in solution in said third solvent.

25. The process as set forth in claim 24 wherein the polymer produced in step A is at least about 40% by weight soluble in said first solvent.

26. The process as set forth in claim 24 wherein the second solvent is selected from the group consisting of hexane, heptanes, octane, petroleum ether, lower alkyl halohydrocarbons and mixtures thereof.

27. The process as set forth in claim 26 wherein the second solvent is heptanes and said third solvent is a photoresist compatible solvent.

28. The process as set forth in claim 24 wherein there is an additional step after step (D), wherein the substantially pure hydroxyl containing polymer in solution is subjected to acetalization wherein said hydroxyl containing polymer solution is reacted with a vinyl either in the presence of an acid catalyst for a sufficient period of time and at a sufficient temperature and pressure to form an acetal derivatized hydroxyl containing polymer in solution.

29. The process as set forth in claim 28 wherein there is an additional step after the formation of the acetal derivatized hydroxyl containing polymer in solution, wherein said solution is neutralized, in a neutralization step, in order to eliminate the acidity thereof.

30. The process as set forth in claim 29 wherein there is an additional step after the neutralization step, wherein there is added to said neutralized acetal derivatized hydroxyl containing polymer in solution, a photoacid generator in order to directly produce a chemically amplified resist composition in solution.

31. The process as set forth in claim 24 wherein the monomer is acetoxystyrene monomer, or an acrylate monomer, or mixtures thereof.

32. The process as set forth in claim 16 wherein the step E is replaced by a precipitation step wherein the polymer is precipitated out of the solution and used as such.

33. A photoresist or photosensitive coating containing the polymer produced by the process of claim 1.

34. A photoresist or photosensitive coating containing the polymer produced by the process of claim 8.

35. A photoresist or photosensitive coating containing the polymer produced by the process of claim 16.

36. A photoresist or photosensitive coating containing the polymer produced by the process of claim 24.

* * * * *